(12) United States Patent
Jagannathan et al.

(10) Patent No.: US 9,515,073 B1
(45) Date of Patent: Dec. 6, 2016

(54) III-V SEMICONDUCTOR CMOS FINFET DEVICE

(71) Applicant: International Business Machines Corporation, Armonk, NY (US)

(72) Inventors: Hemanth Jagannathan, Niskayuna, NY (US); Alexander Reznicek, Troy, NY (US); Devendra K. Sadana, Pleasantville, NY (US); Charan V. Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/017,871

(22) Filed: Feb. 8, 2016

(51) Int. Cl.
| H01L 21/302 | (2006.01) |
| H01L 27/092 | (2006.01) |
| H01L 21/02 | (2006.01) |
| H01L 29/10 | (2006.01) |
| H01L 29/20 | (2006.01) |
| H01L 29/16 | (2006.01) |
| H01L 29/161 | (2006.01) |

(Continued)

(52) U.S. Cl.
CPC ....... *H01L 27/0924* (2013.01); *H01L 21/0245* (2013.01); *H01L 21/02538* (2013.01); *H01L 21/302* (2013.01); *H01L 21/8252* (2013.01); *H01L 21/823821* (2013.01); *H01L 27/0605* (2013.01); *H01L 29/1083* (2013.01); *H01L 29/16* (2013.01); *H01L 29/161* (2013.01); *H01L 29/20* (2013.01)

(58) Field of Classification Search
CPC .......... H01L 21/823431; H01L 21/845; H01L 27/0886; H01L 27/10826; H01L 29/66795; H01L 29/7831; H01L 29/785; H01L 23/53223; H01L 29/1054; H01L 29/7378; H01L 33/30; H01L 21/0245
USPC ........ 257/288, 368, 369; 438/151, 197, 199, 438/443, 689, 938
See application file for complete search history.

(56) References Cited

U.S. PATENT DOCUMENTS

| 4,588,451 A | 5/1986 | Vernon |
| 8,937,299 B2 | 1/2015 | Basu et al. |
| (Continued) | | |

FOREIGN PATENT DOCUMENTS

TW  201445735 A  12/2014

*Primary Examiner* — Jarrett Stark
*Assistant Examiner* — Shahed Ahmed
(74) *Attorney, Agent, or Firm* — Cantor Colburn LLP; Vazken Alexanian

(57) ABSTRACT

A method for forming a semiconductor device comprises forming an insulator layer on a semiconductor substrate, removing portions of the insulator layer to form a first cavity and a second cavity, the first cavity exposing a first portion of the semiconductor substrate an the second cavity exposing a second portion of the semiconductor substrate, growing a first semiconductor material in the first cavity and the second cavity. Growing a second semiconductor material on the first semiconductor material in the first cavity and the second cavity, growing a third semiconductor material on the second semiconductor material in the first cavity and the second cavity. Forming a mask over the third semiconductor material in the first cavity, removing the third semiconductor material from the second cavity to expose the second semiconductor material in the second cavity, and growing a fourth semiconductor material on the second semiconductor material in the second cavity.

17 Claims, 14 Drawing Sheets

(51) Int. Cl.
    *H01L 21/8252*    (2006.01)
    *H01L 21/8238*    (2006.01)
    *H01L 27/06*       (2006.01)

(56) References Cited

U.S. PATENT DOCUMENTS

| | | | |
|---|---|---|---|
| 9,385,218 B1* | 7/2016 | Cheng | H01L 29/66795 |
| 2010/0078680 A1 | 4/2010 | Cheng et al. | |
| 2013/0256828 A1* | 10/2013 | Lee | H01L 27/04 257/506 |
| 2014/0264607 A1 | 9/2014 | Basu et al. | |
| 2015/0244151 A1 | 8/2015 | Liu et al. | |
| 2015/0295070 A1* | 10/2015 | Zhu | H01L 29/66795 257/192 |
| 2015/0325436 A1 | 11/2015 | Bentley et al. | |
| 2015/0340290 A1* | 11/2015 | Zhu | H01L 21/823821 257/401 |
| 2016/0118480 A1* | 4/2016 | Xie | H01L 29/66795 257/347 |
| 2016/0204037 A1* | 7/2016 | Goel | H01L 21/823807 438/429 |

\* cited by examiner

III-V SEMICONDUCTOR CMOS FINFET DEVICE

BACKGROUND

The present invention generally relates to complimentary metal-oxide semiconductors (CMOS) and metal-oxide-semiconductor field-effect transistors (MOSFET), and more specifically, to FinFET device fabrication.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Since the fin provides a three dimensional surface for the channel region, a larger channel length may be achieved in a given region of the substrate as opposed to a planar FET device.

As CMOS scales to smaller dimensions, III-V compound materials have become useful in forming CMOS devices. Generally, III-V compound materials include group III elements such as, aluminum, gallium, and indium (Al, Ga, and In) and group V elements such as, nitrogen, phosphorous, arsenic, and Antimony (N, P, As, and Sb). Some examples of III-V compounds used in CMOS devices include GaAs, InP, GaP, GaN, InGaAs, AlAs, and InAlAs.

As the supply voltages of smaller CMOS devices are reduced, the performance of silicon is degraded. An advantage of III-V compound materials is that the III-V compound materials often have a higher electron velocity than silicon. The use of III-V compound materials often results in improved short-channel effects in CMOS devices.

Gate spacers form an insulating film along the gate sidewalls. Gate spacers may also initially be formed along sacrificial gate sidewalls in replacement gate technology. The gate spacers are used to define source/drain regions in active areas of a semiconductor substrate located adjacent to the gate.

Device scaling drives the semiconductor industry, which reduces costs, decreases power consumption, and provides faster devices with increased functions per unit area. Improvements in optical lithography have played a major role in device scaling. However, optical lithography has limitations for minimum dimensions, which are determined by the wavelength of the irradiation.

SUMMARY

According to an embodiment of the present invention, a method for forming a semiconductor device comprises forming an insulator layer on a semiconductor substrate, removing portions of the insulator layer to form a first cavity and a second cavity, the first cavity exposing a first portion of the semiconductor substrate an the second cavity exposing a second portion of the semiconductor substrate, growing a first semiconductor material in the first cavity and the second cavity, growing a second semiconductor material on the first semiconductor material in the first cavity and the second cavity, growing a third semiconductor material on the second semiconductor material in the first cavity and the second cavity, forming a mask over the third semiconductor material in the first cavity, removing the third semiconductor material from the second cavity to expose the second semiconductor material in the second cavity, and growing a fourth semiconductor material on the second semiconductor material in the second cavity.

According to another embodiment of the present invention, a method for forming a semiconductor device comprises forming an insulator layer on a semiconductor substrate, removing portions of the insulator layer to form a first cavity and a second cavity, the first cavity exposing a first portion of the semiconductor substrate an the second cavity exposing a second portion of the semiconductor substrate, growing a first semiconductor material in the first cavity and the second cavity, growing a second semiconductor material on the first semiconductor material in the first cavity and the second cavity, growing a third semiconductor material on the second semiconductor material in the first cavity and the second cavity, forming a mask over the third semiconductor material in the first cavity, removing the third semiconductor material from the second cavity and the second semiconductor material from the second cavity to expose the first semiconductor material in the second cavity, and growing a fourth semiconductor material on the first semiconductor material in the second cavity, and growing a fifth semiconductor material on the second semiconductor material in the second cavity.

According to yet another embodiment of the present invention, a semiconductor device comprises a semiconductor substrate, a first fin arranged on the substrate, the first fin comprises a first III-V compound material, a punch through stopper region arranged on the first III-V compound material, and a first semiconductor material arranged on the punch through stopper region, and a second fin arranged on the substrate, the second fin comprises the first III-V compound material, a punch through stopper region arranged on the first III-V compound material, and a second III-V compound material arranged on the punch through stopper region.

BRIEF DESCRIPTION OF THE DRAWINGS

FIG. 1 illustrates a side view of a semiconductor-on-insulator (SOI) wafer.

FIG. 2 illustrates a side view following the formation of an oxide layer (insulator layer) over the semiconductor substrate.

FIG. 3 illustrates a side view following the patterning of a hardmask layer over the oxide layer.

FIG. 4 illustrates a side view following an anisotropic etching process such as, for example, reactive ion etching (RIE) that removes exposed portions of the oxide layer and exposes portions of the substrate in the cavities.

FIG. 5 illustrates a side view following the removal of the hardmask layer (of FIG. 4) using a suitable removal process.

FIG. 6 illustrates a side view of the resultant structure following the formation of first fins, a punch through stopper layer, and second fins.

FIG. 7 illustrates a side view following a planarization process.

FIG. 8 illustrates a side view following the formation of a mask over the first group of fins, which leaves the second group of fins exposed.

FIG. 9 illustrates a side view following the removal of exposed portions of the second fins in the second group of fins.

FIG. 10 illustrates a side view following another epitaxial growth process that forms second fins in the second group of fins.

FIG. 11 illustrates a side view following a planarization process.

FIG. 12 illustrates a side view following a selective etching process that removes exposed portions of the oxide layer.

FIG. 13 illustrates the resultant structure following a similar process as described above in FIGS. 1-9.

FIG. 14 illustrates a side view following the removal of the exposed punch through stopper layer (of FIG. 13) of the second group of fins.

FIG. 15 illustrates a side view following an epitaxial growth process that forms a punch through stopper layer.

FIG. 16 illustrates a side view following a planarization process.

FIG. 17 illustrates a top view of an arrangement of fins.

FIG. 18 illustrates a cut-away view along the line A-A (of FIG. 17) showing the first group of fins and the second group of fins.

FIG. 19 illustrates a cut-away view along the line A-A (of FIG. 20) following the formation of a sacrificial gate over the fins.

FIG. 20 illustrates a top view following the formation of the sacrificial gate and spacers.

FIG. 21 illustrates a top view following the formation of source/drain regions.

FIG. 22 illustrates a cut-away view along the line B-B (of FIG. 21) following the formation of the source/drain regions.

DETAILED DESCRIPTION

The use of III-V compounds in CMOS devices offers many advantages including improved performance FET devices at lower supply voltages. Often it is desirable to form a CMOS device having a pFET and an nFET that use dissimilar semiconductor materials for the active regions of the device. Thus, it is desirable to form a CMOS device having a first FET (e.g., pFET) with a SiGe or Si active region and a second FET (e.g., nFET) with a III-V compound active region.

One of the challenges of forming CMOS devices with dissimilar active regions on a substrate is that the epitaxially grown materials may have lattice constants that do not match well with the underlying seed layers having dissimilar lattice constants. This may result in undesirable defects in the epitaxially grown active regions. The defects may degrade the performance of the devices.

FIGS. 1-12 illustrate an exemplary method for fabricating epitaxially grown semiconductor fins on a substrate using Si, SiGe, or Ge materials and III-V compound materials while minimizing defects in the epitaxially grown active regions.

Figure 1:
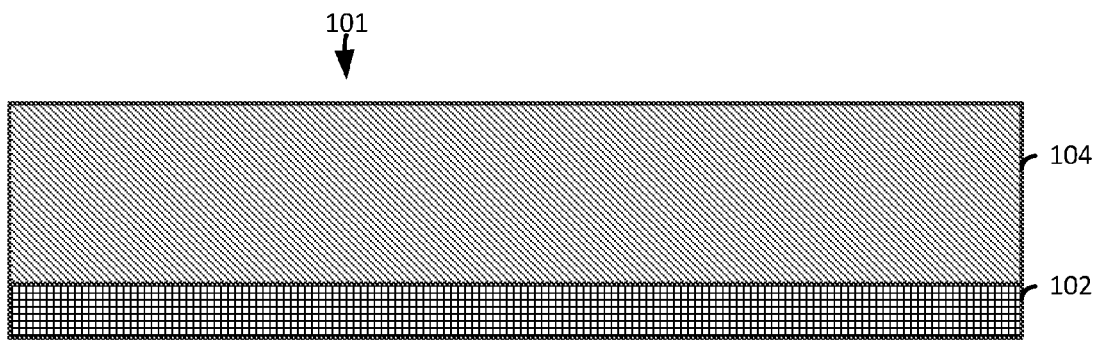
FIGS. 1-12 illustrate an exemplary method for fabricating epitaxially grown semiconductor fins on a substrate using Si, SiGe, or Ge materials and III-V compound materials while minimizing defects in the epitaxially grown active regions.

FIG. 1 illustrates a side view of a semiconductor-on-insulator (SOI) wafer 101. The SOI wafer 101 includes an insulator layer 102 and a semiconductor substrate (substrate) 104 arranged on the insulator layer 102. The SOI wafer 101 can be formed by any suitable technique such as, for example wafer bonding, Smartcut™, SIMOX (Separation by IMplanted Oxygen).

The semiconductor substrate 104 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

The insulator layer 102 may include, for example, a buried oxide (BOX) material or other suitable insulator materials. Examples of suitable insulator materials include, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The thickness of insulator layer 102 generally varies and is not intended to be limited. In one aspect, the thickness of the insulator layer 102 is in a range from about 10 nm to about 1000 nm. The insulator layer 102 can be formed by any suitable process such as thermal oxidation, thermal nitridation, chemical vapor deposition (CVD).

Figure 2:
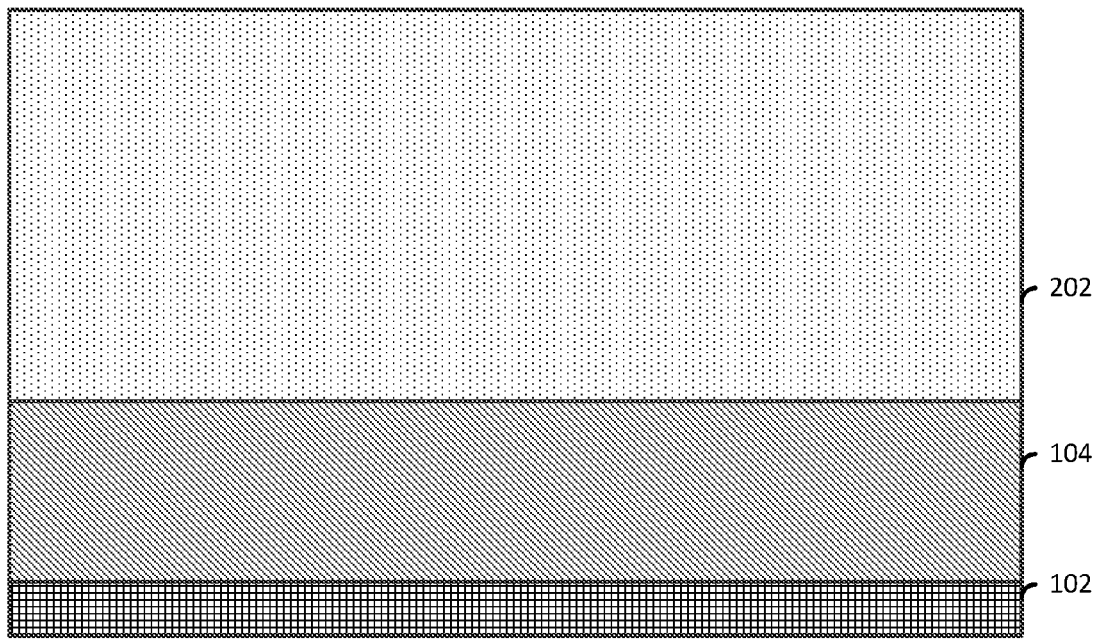

FIG. 2 illustrates a side view following the formation of an oxide layer (insulator layer) 202 over the semiconductor substrate 104. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The oxide layer 202 in the illustrated embodiment has a thickness of about 80 nm to about 200 nm.

Figure 3:
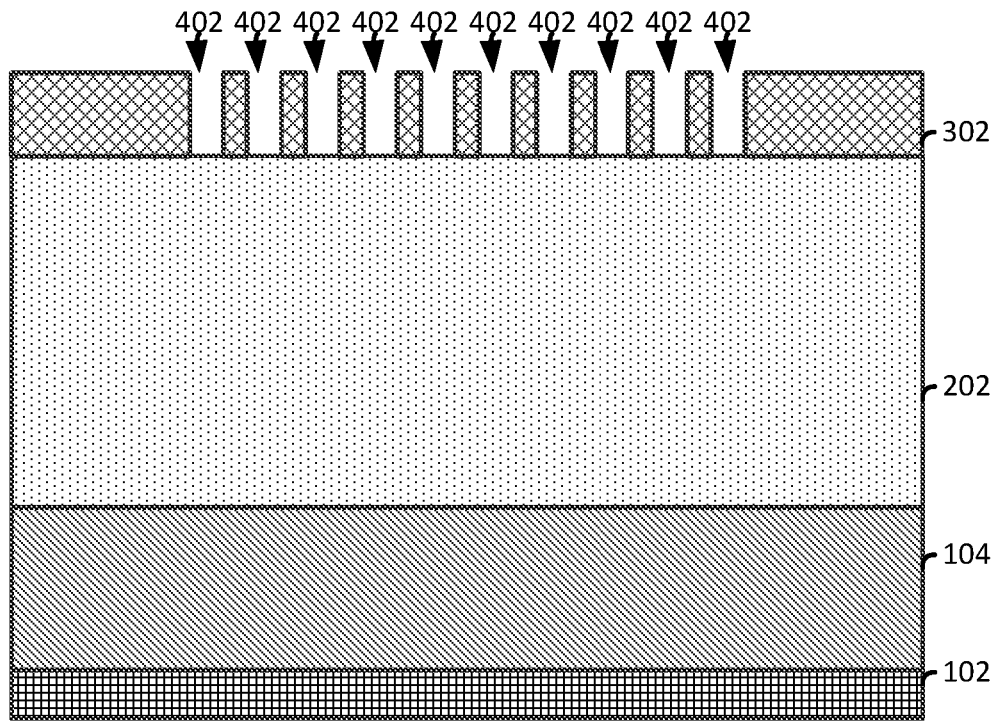

FIG. 3 illustrates a side view following the patterning of a hardmask layer 302 over the oxide layer 202. The hardmask layer 302 partially defines cavities 402. The hardmask layer 302 may include, for example, silicon oxide, silicon nitride (SiN), SiOCN, SiBCN or any suitable combination of those Hardmask layer 302 may be deposited using a deposition process, including, but not limited to, PVD, CVD, PECVD, or any combination thereof. Though the illustrated exemplary embodiment includes a hardmask layer 302, alternate exemplary embodiments may use other processes for forming a patterning layer on the oxide layer 202. For example, a sidewall image transfer process, or another suitable lithographic patterning process may be used to form a pattern similar to the hardmask layer 302.

Figure 4:
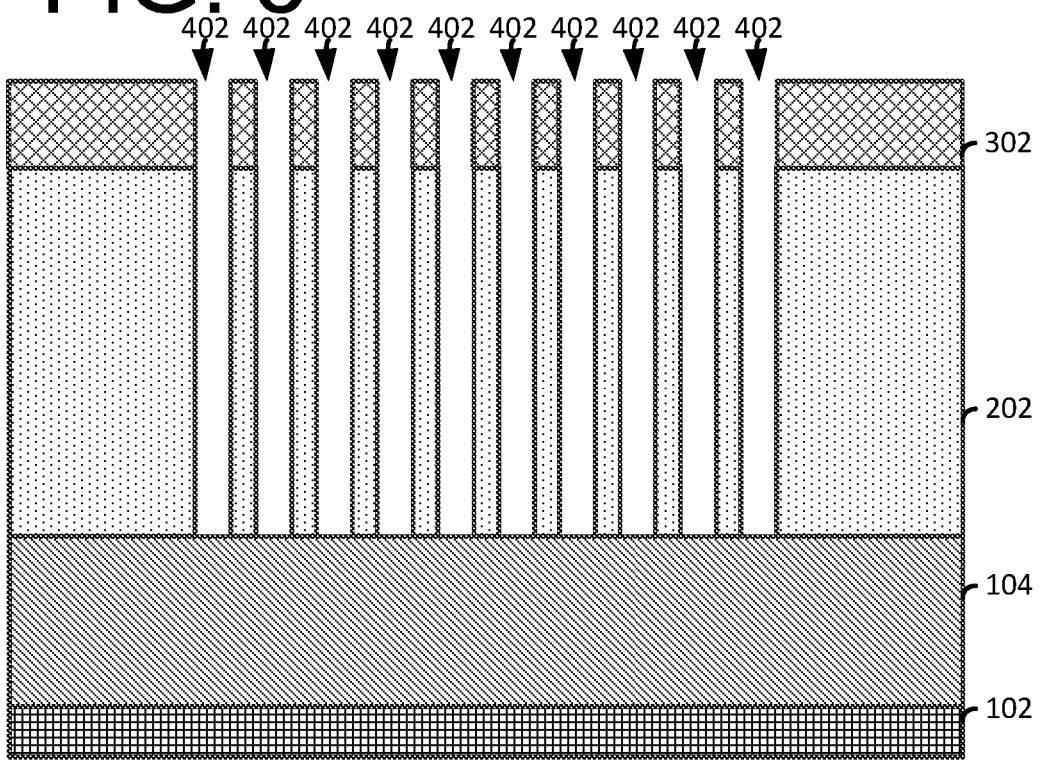

FIG. 4 illustrates a side view following an anisotropic etching process such as, for example, reactive ion etching (RIE) that removes exposed portions of the oxide layer 202 and exposes portions of the substrate 104 in the cavities 402.

Figure 5:
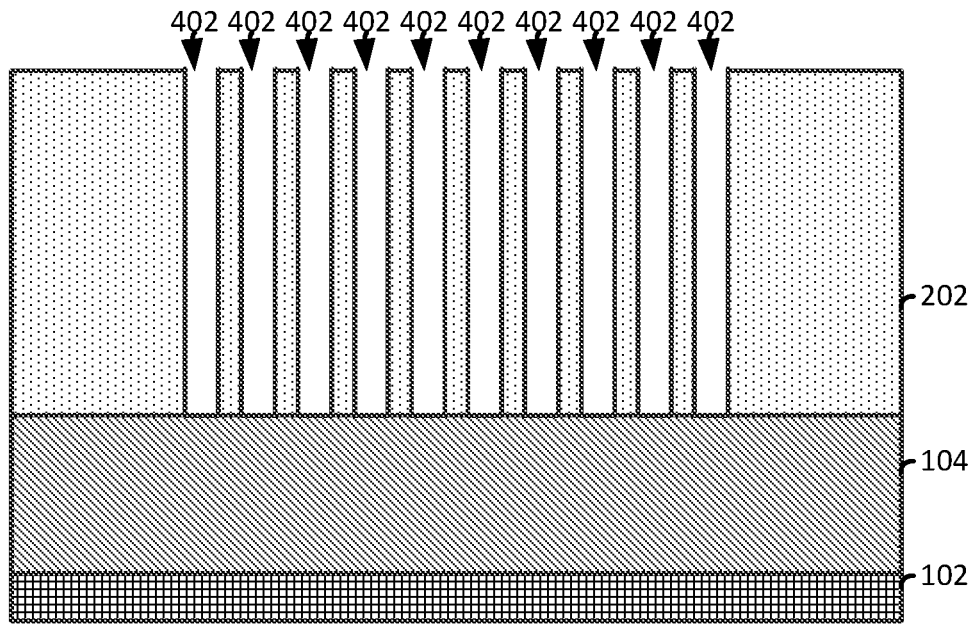

FIG. 5 illustrates a side view following the removal of the hardmask layer 302 (of FIG. 4) using a suitable removal process.

Figure 6:
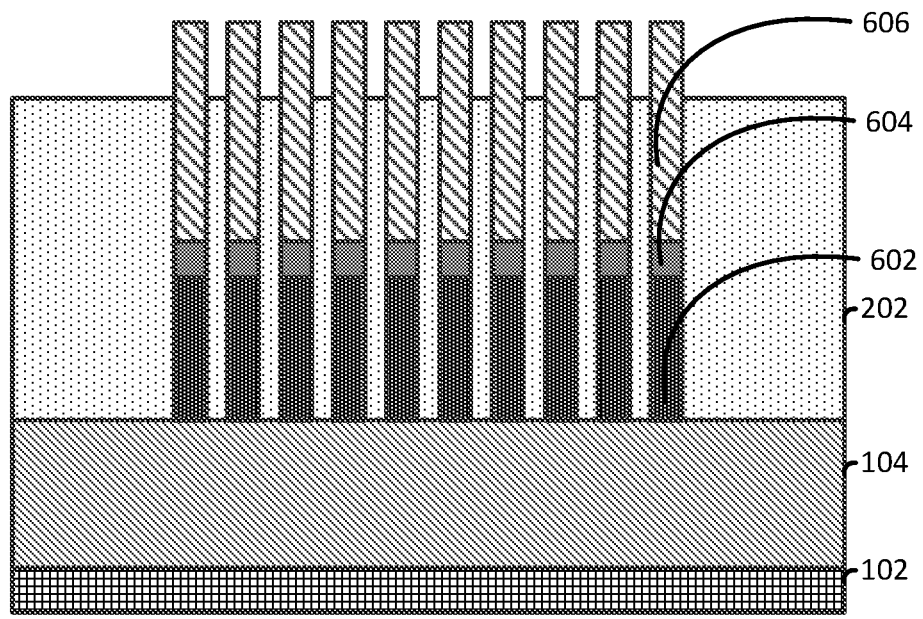

FIG. 6 illustrates a side view of the resultant structure following the formation of first fins 602, a punch through stopper layer 604, and second fins 606. In this regard, the fins 602 are epitaxially grown on exposed portions of the substrate 104 in the cavities 401 (of FIG. 5), once the first fins 602 are formed, the punch through stopper layer 604 is epitaxially grown on exposed surfaces of the first fins 602 in the cavities 401. Following the formation of the punch through stopper layer 604, the second fins 606 are epitaxially grown on the exposed portions of the punch through stopper layer 604.

In the illustrated embodiment, the first fins 602, the punch through stopper layer 604, and the second fins 606 may be formed sequentially in a single epitaxy chamber. Such a fabrication process reduces the exposure of the device to contaminants and reduces the chances of undesired oxide formation.

In the illustrated embodiment, the first fins 602 comprise a III-V crystalline material such as, for example, gallium arsenide or indium phosphide. The punch through stopper layer 604 comprises a III-V crystalline material such as, for example, AlAs or InAlAs. The second fins 606 include a crystalline semiconductor material such as, for example, Si, SiGe, or Ge.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon may be used. Examples of metal organic precursors include, for an epitaxial gallium layer, trimethylgallium, for an indium layer, Trimethylindium, for an aluminium layer trimethylbluminium, for an arsenic layer tertiary butyl arsine, for a phosphorus layer tertiary butyl phosphine, for an antimony layer, Triethyl or trimethyl antimony precursor.

Figure 7:
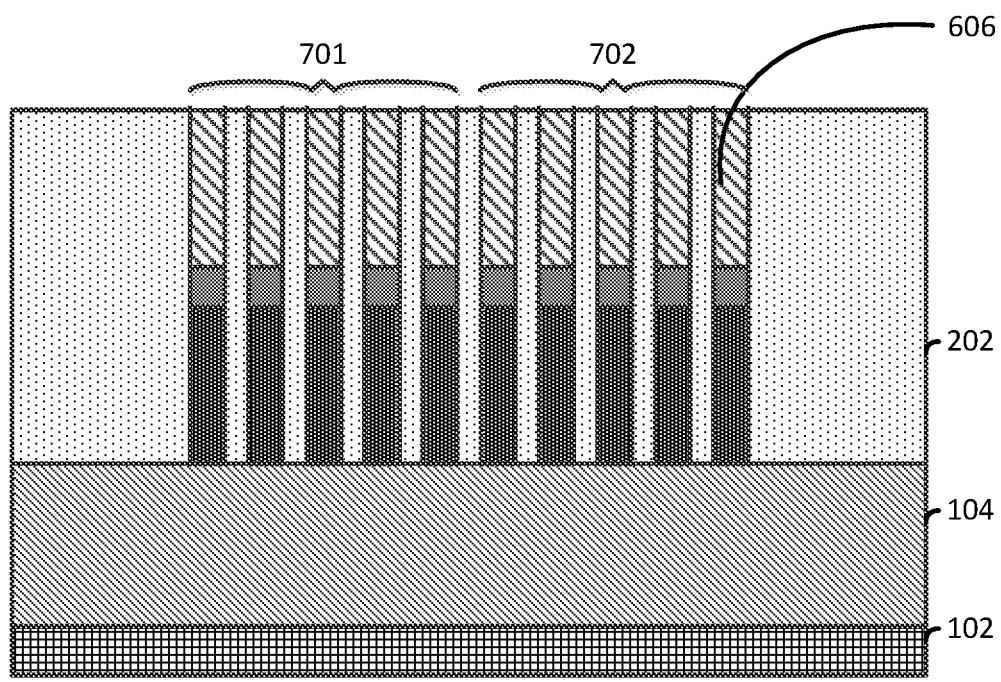

FIG. 7 illustrates a side view following a planarization process such as, for example chemical mechanical polishing (CMP) that removes overburdened portions of the second fins 606. In the illustrated embodiment there are two groups of fins 606 that may be used to form CMOS devices a first group of fins 701 and a second group of fins 702.

Figure 8:
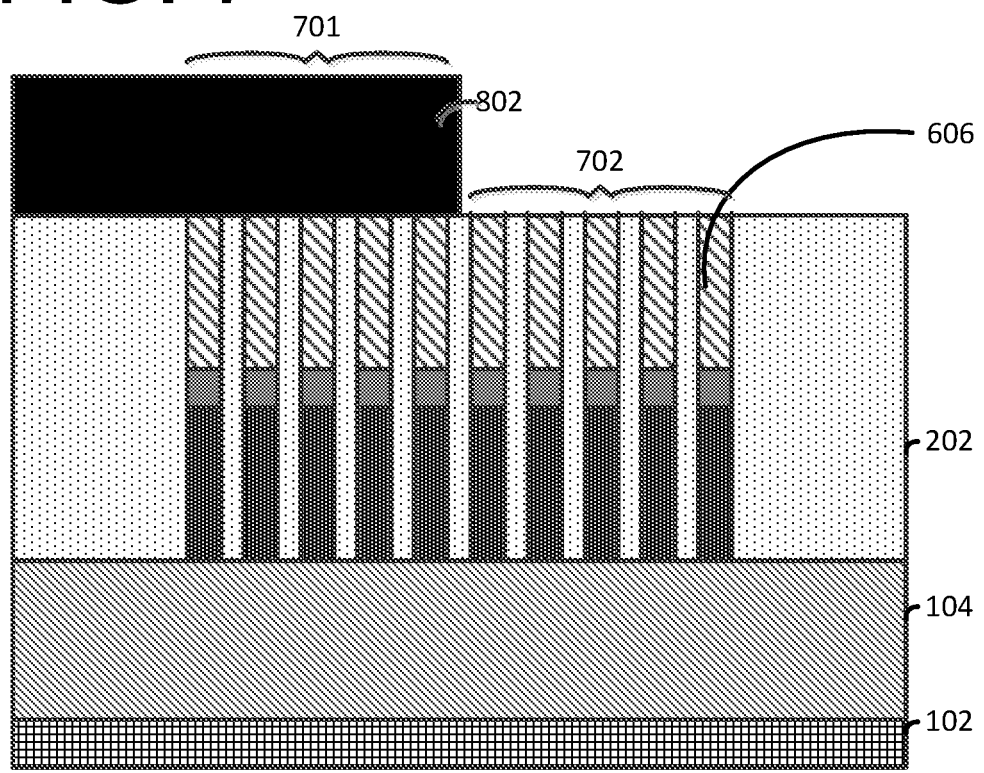

FIG. 8 illustrates a side view following the formation of a mask 802 over the first group of fins 701, which leaves the second group of fins 702 exposed. Suitable masks include photoresists, electron-beam resists, ion-beam resists, X-ray resists, and etch resists. The resist may a polymeric spin on material or a polymeric material.

Figure 9:
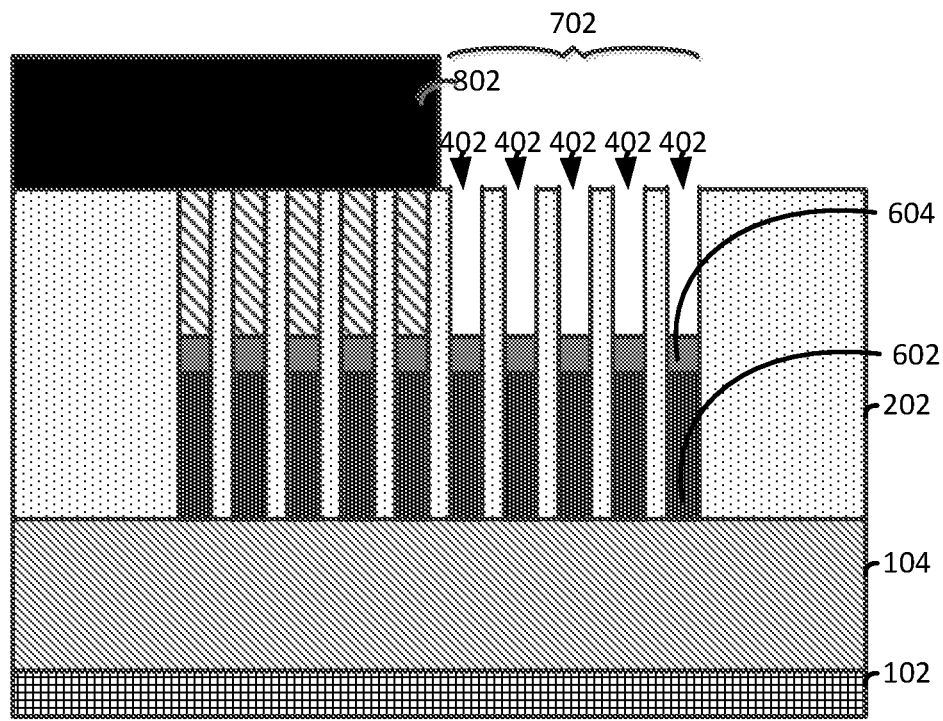

FIG. 9 illustrates a side view following the removal of exposed portions of the second fins 606 in the second group of fins 702 using a suitable selective etching process such as, for example, an HCl or wet etch process. The removal of the exposed second fins 606 exposes the punch through stopper layer 604 in the second group of fins 702 and reopens the cavities 402.

Figure 10:
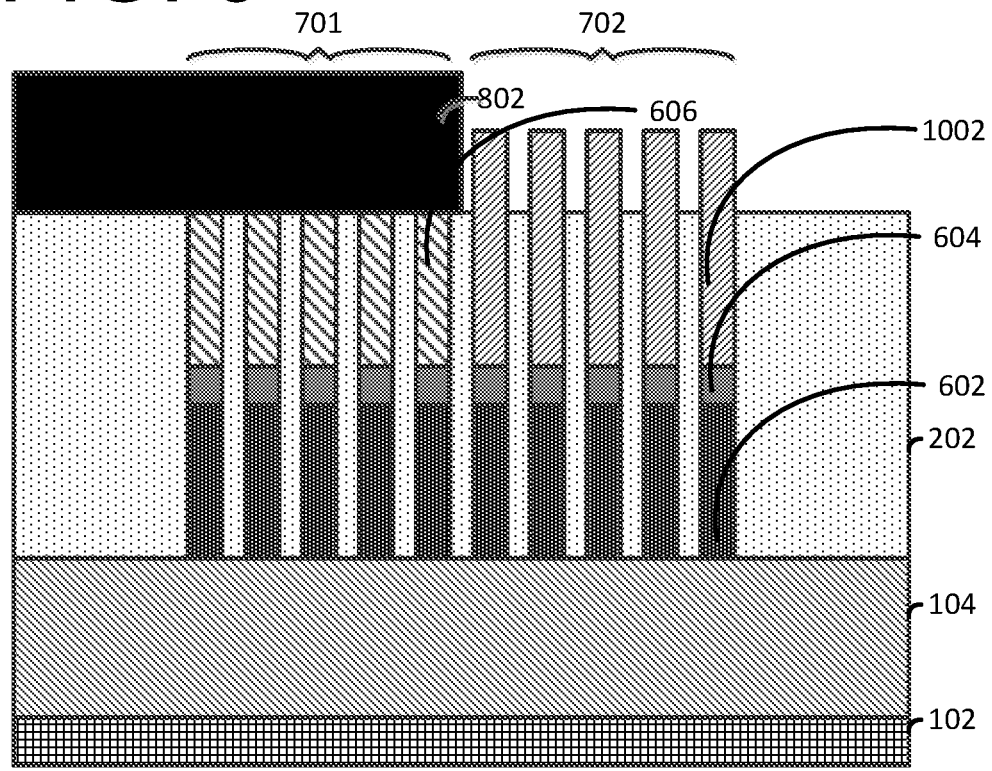

FIG. 10 illustrates a side view following another epitaxial growth process that forms second fins 1002 in the second group of fins 702 from a dissimilar material than the second fins 606 in the first group of fins 701. In the illustrated exemplary embodiment, the second fins 1002 include a crystalline InGaAs material or another suitable III-V compound semiconductor material.

Figure 11:
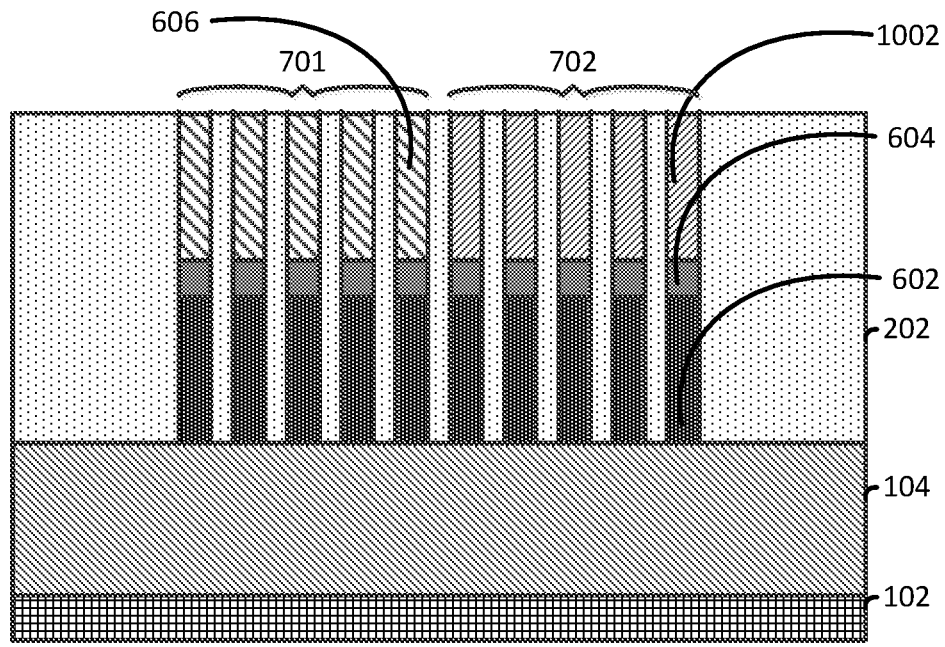

FIG. 11 illustrates a side view following a planarization process, such as, for example, chemical mechanical polishing that removes the overburden portions of the second fins 1002 to further form the second fins 1002.

Figure 12:
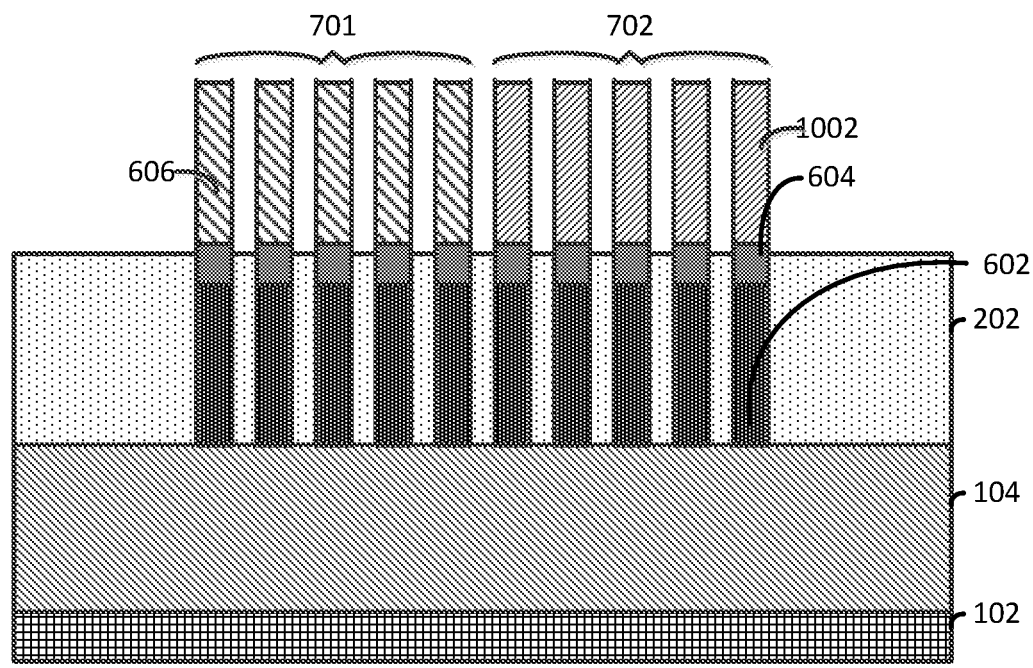

FIG. 12 illustrates a side view following a selective etching process such as, for example, reactive ion etching or aqueous hydrofluoric acid processes that remove exposed portions of the oxide layer 202 to expose the first fins 606 and the second fins 1002.

The resultant structure in FIG. 12 includes first fins 606 that comprise a first crystalline semiconductor material such as, for example, Si, SiGe, or Ge, and second fins 1002 that comprise a second semiconductor material such as, for example, a III-V compound material like InAlAs. Though the first fins 606 and the second fins 1002 comprise of dissimilar materials, the process described herein results in the first fins 606 and the second fins 1002 having a very low amount of defects. The reduction in the defects in the second fins 1002 is facilitated by growing the second fins 1002 on the punch through stopper layer having a low lattice mismatch between the punch through stopper layer material and the III-V compound material. In the illustrated embodiment the lattice mismatch is less than about 1.0%.

FIGS. 13-16 illustrate another exemplary method for fabricating epitaxially grown semiconductor fins on a substrate using Si, SiGe, or Ge materials and III-V compound materials while minimizing defects in the epitaxially grown active regions.

Figure 13:
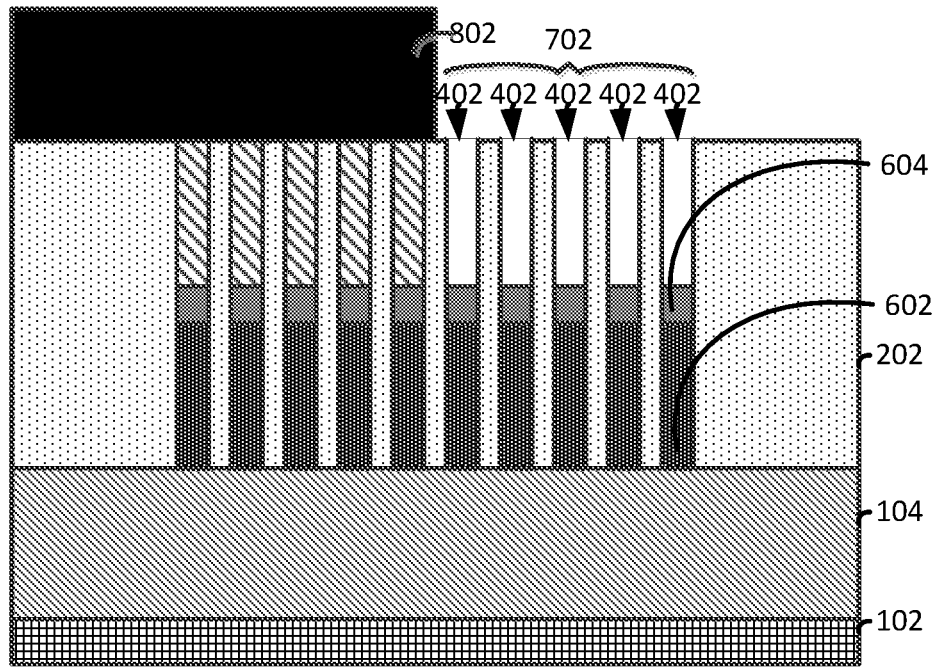
FIGS. 13-16 illustrate another exemplary method for fabricating epitaxially grown semiconductor fins on a substrate using Si, SiGe, or Ge materials and III-V compound materials while minimizing defects in the epitaxially grown active regions.

FIG. 13 illustrates a side view similar to FIG. 9 described above. In this regard, FIG. 13 illustrates the resultant structure following a similar process as described above in FIGS. 1-9 following the removal of exposed portions of the second fins 606 in the second group of fins 702 using a suitable selective etching process such as, for example, an HCl or wet etch process. The removal of the exposed second fins 606 exposes the punch through stopper layer 604 in the second group of fins 702 and reopens the cavities 402.

Figure 14:
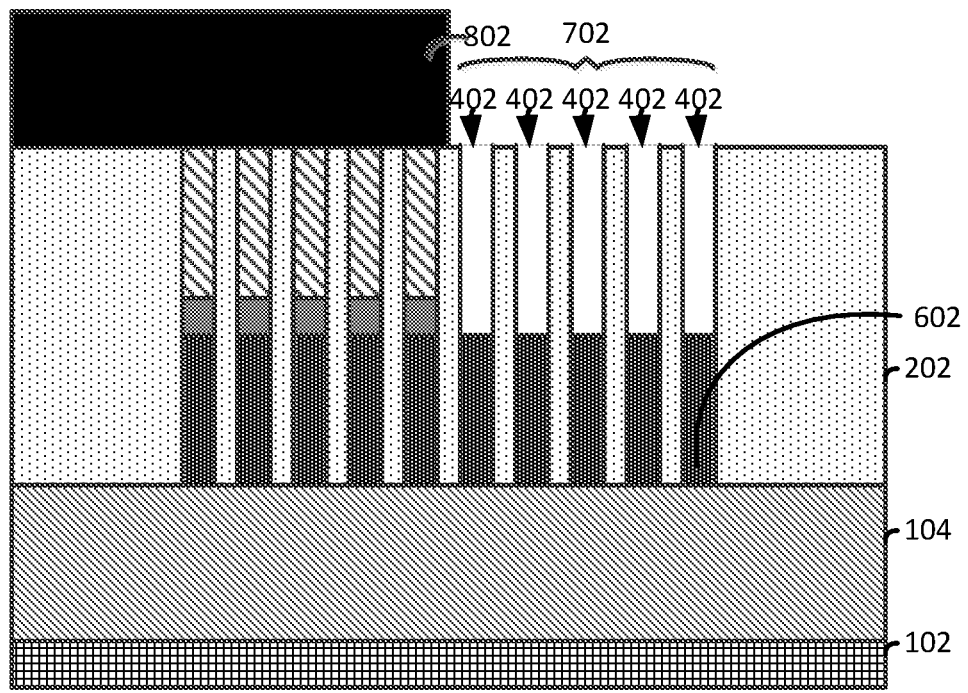

FIG. 14 illustrates a side view following the removal of the exposed punch through stopper layer 604 (of FIG. 13) of the second group of fins 702 in the cavities 402. The exposed punch through stopper layer 604 is removed by a suitable etching process such as, for example, a citric acid or hydrogen peroxide etching process.

Figure 15:
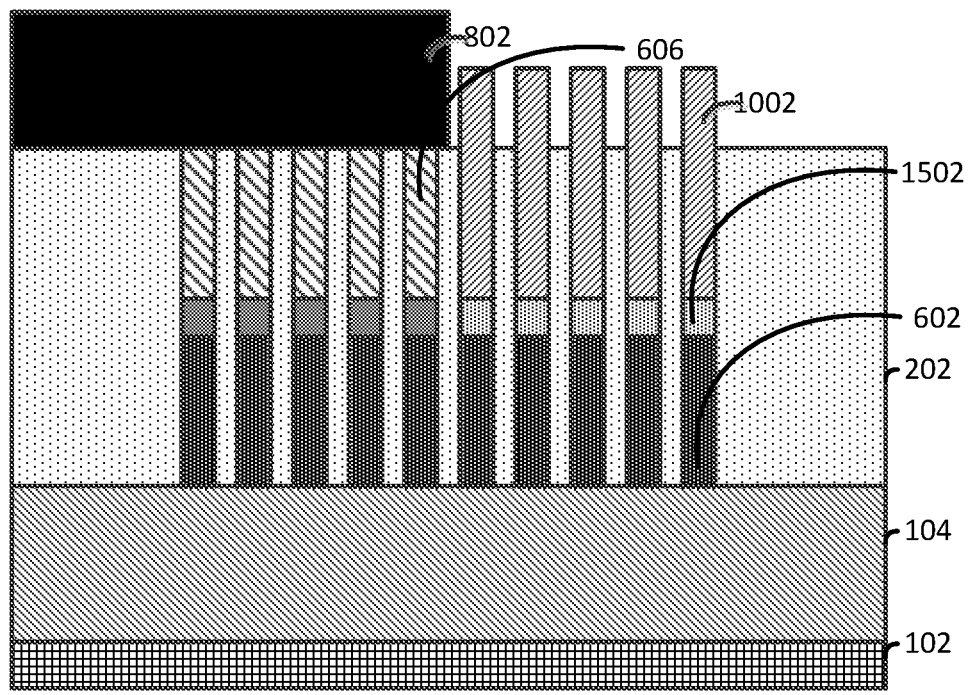

FIG. 15 illustrates a side view following an epitaxial growth process that forms a punch through stopper layer 1502 on exposed portions of the first fins 602 of the second group of fins 702 followed by the epitaxial growth of the second fins 1002 over exposed portions of the punch through stopper layer 1502.

Figure 16:
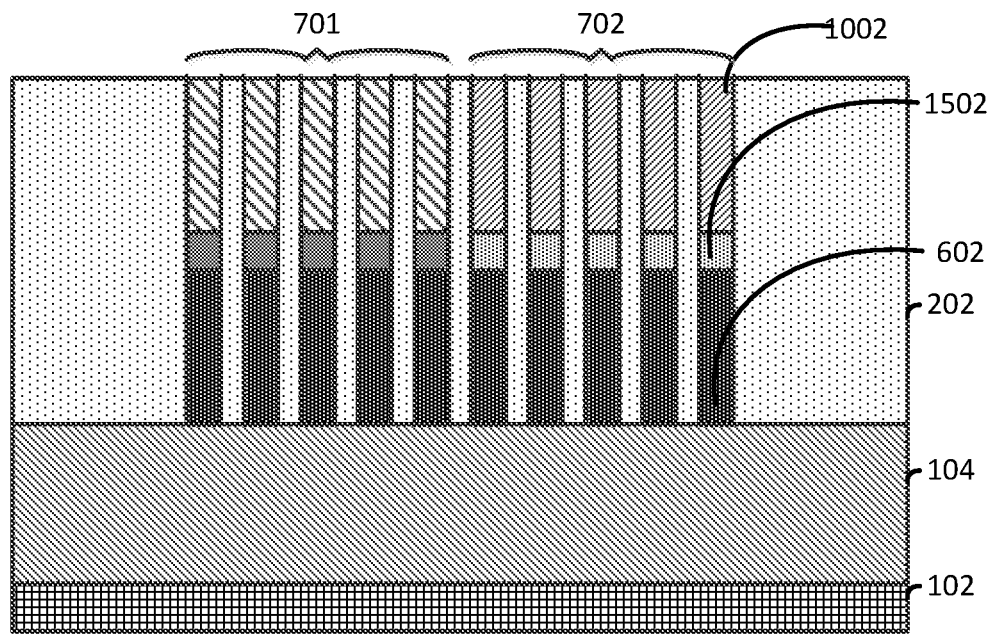

FIG. 16 illustrates a side view following a planarization process such as, for example, CMP that removes the overburden portion of the fins 1002. Following the planarization process, the oxide layer 202 may be etched to expose the fins 1002 and the fins 604 as described above in FIG. 12.

FIGS. 17-22 illustrate an exemplary method for forming FET devices using the fins described above.

Figure 17:
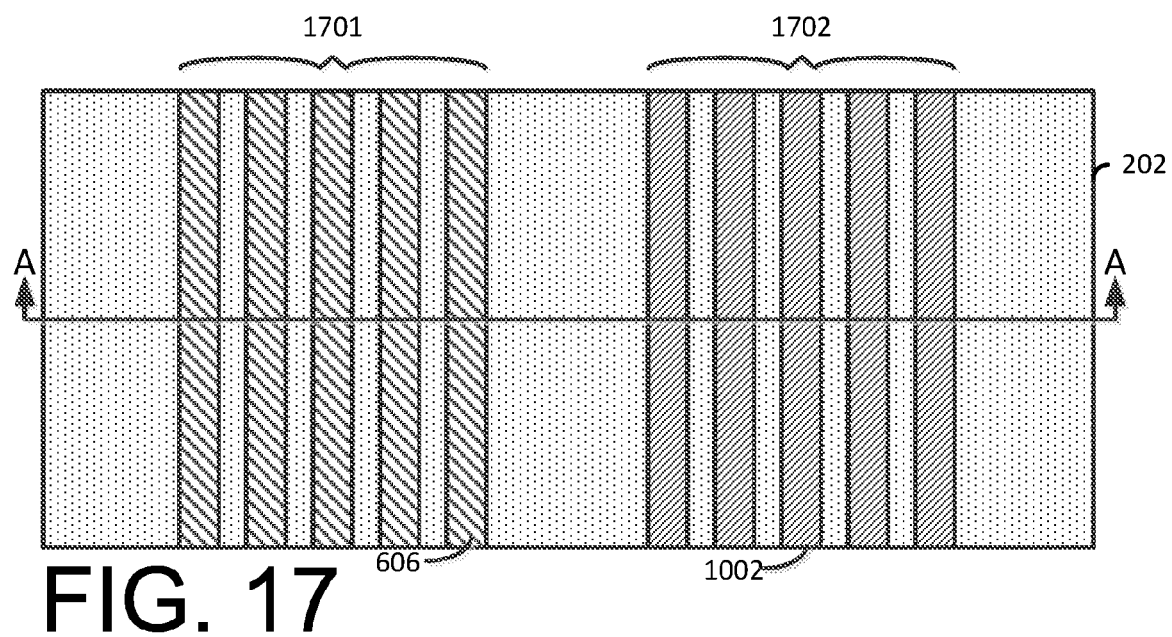
FIGS. 17-22 illustrate an exemplary method for forming FET devices.

FIG. 17 illustrates a top view of an arrangement of fins 606 and 1002 that have been fabricated using similar methods as described above. In the illustrated exemplary embodiment, first group of fins 1701 has been arranged adjacent to a second group of fins 1702.

Figure 18:
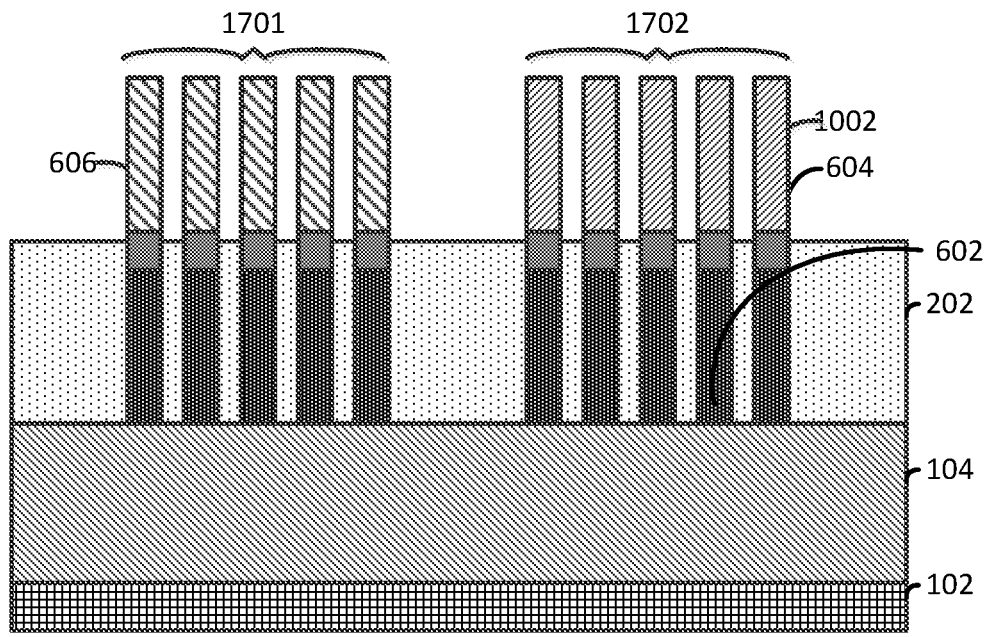

FIG. 18 illustrates a cut-away view along the line A-A (of FIG. 17) showing the first group of fins 1701 and the second group of fins 1702.

Figure 19:
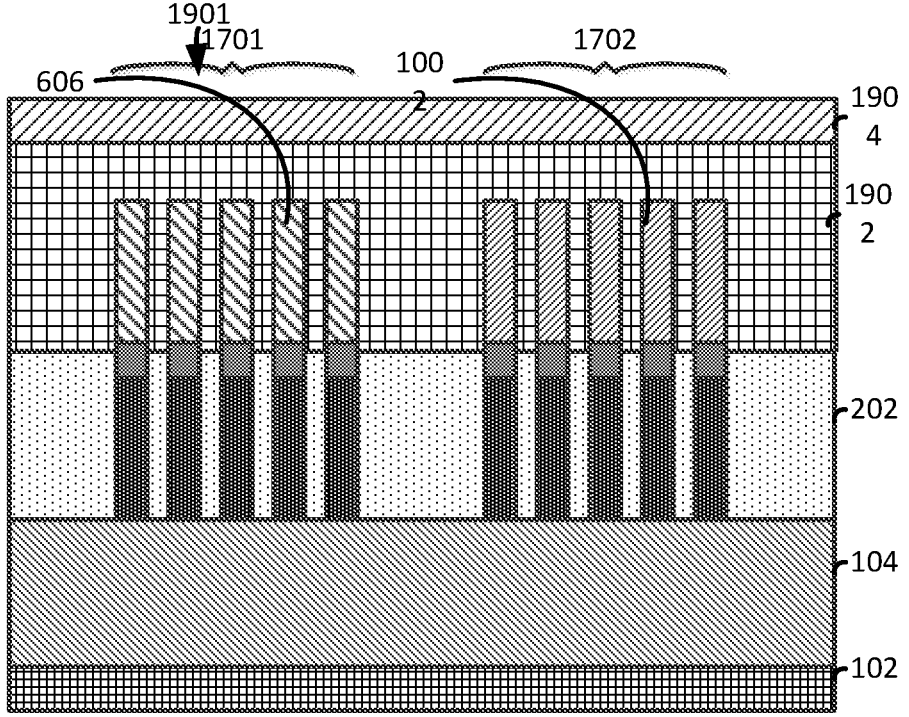

FIG. 19 illustrates a cut-away view along the line A-A (of FIG. 20) following the formation of a sacrificial gate 1901 over the fins 606 and 1002. The sacrificial gates 1901 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 1901 may further comprises a sacrificial gate dielectric material such as silicon oxide between the nanowires and aSi or polysilicon material.

The layer sacrificial gate material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hardmask or sacrificial gate cap 1904. The hardmask layer may be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching is performed to remove exposed portions of the hardmask layer and the layer of sacrificial gate material form the sacrificial gate 1901 and the gate caps 1904.

Figure 20:
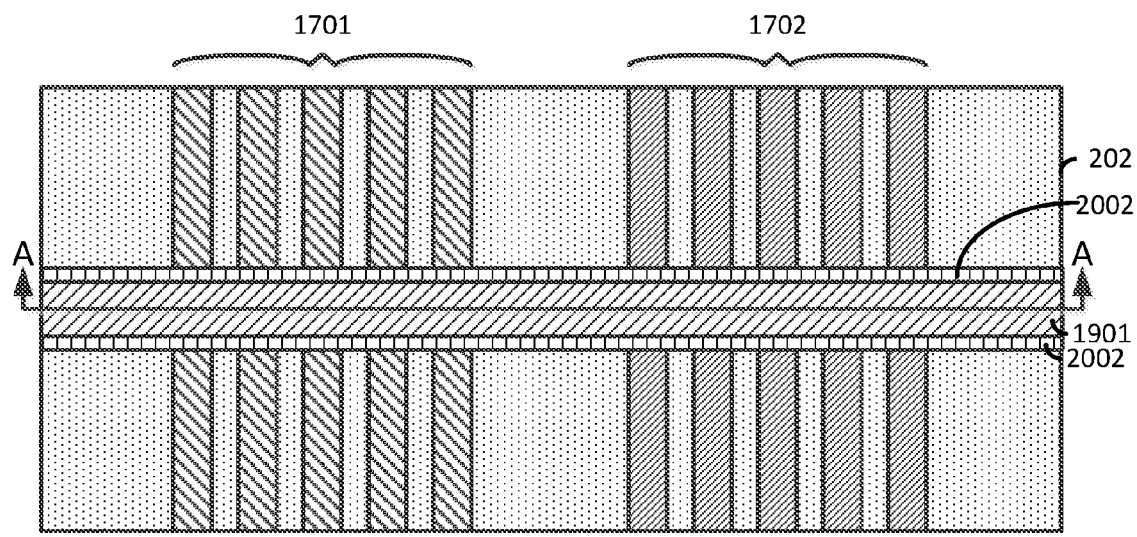

FIG. 20 illustrates a top view following the formation of the sacrificial gate 1902 and spacers 2002. The spacers 2202 are formed adjacent to the sacrificial gates 1901. The spacers 2202 in the illustrated embodiment are formed by depositing a layer of spacer material (not shown) over the exposed portions of the oxide layer 202, the fins 606 and 1002, and the sacrificial gates 1901. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD). Following the deposition of the layer of spacer material, a suitable anisotropic etching process such as, for example, a reactive ion etching process is performed to remove portions of the layer of spacer material and form the spacers 2202.

FIG. 20 illustrates a top view following the formation of source/drain regions 2102 and 2104. The source/drain regions 2102 and 2104 are formed by an epitaxial growth process that deposits a crystalline overlayer of semiconductor material onto the exposed crystalline seed material of the exposed fin 606 and 1002 to form the source/drain regions 2102 and 2104. For p-type device, epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ to $1\times10^{21}$ cm$^{-3}$. For n-type devices, the source/drain regions may include, for example, tellurium doped InGaAs or InAs, having a doping level from $5\times10^{19}$ to $1.5\times10^{20}$ atoms/cm$^3$.

Figure 21:
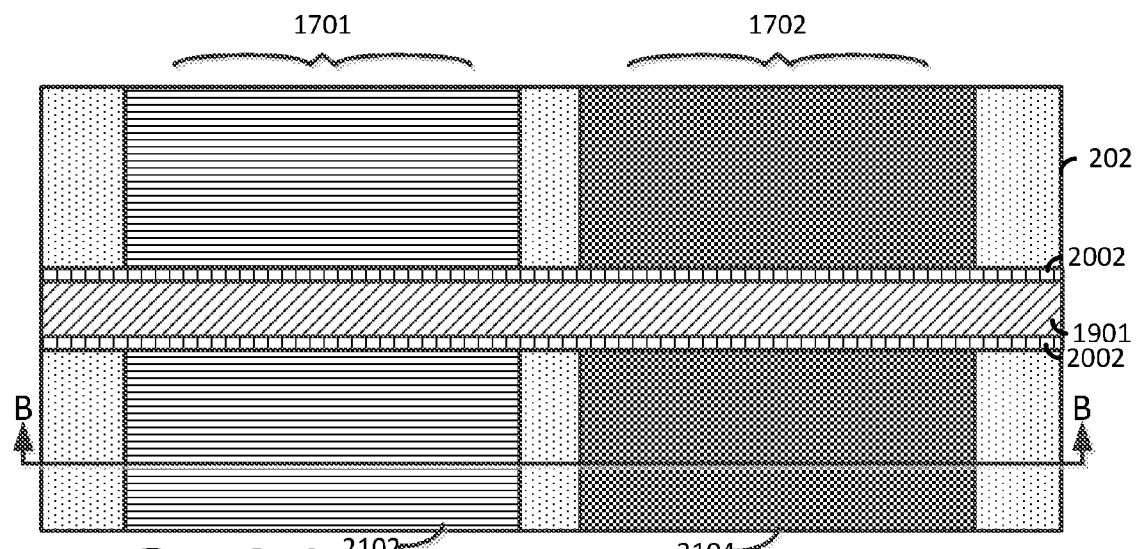
Figure 22:
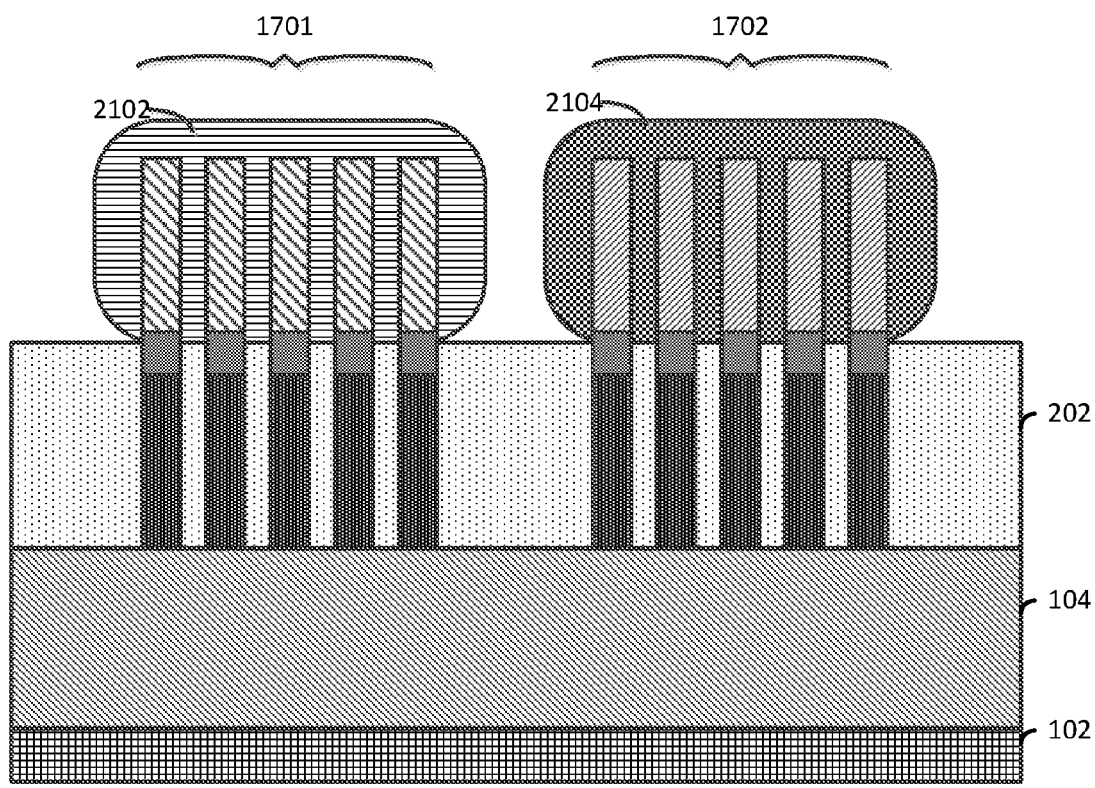

FIG. 21 illustrates a top view following the formation of source/drain regions 2102 and 2104. The source/drain regions 2102 and 2104 may be formed from dissimilar materials in some alternate embodiments. In such alternate embodiments, a masking process may be used to provide for the formation of source/drain regions 2012 and 2014 having dissimilar materials. FIG. 22 illustrates a cut-away view along the line B-B (of FIG. 21) following the formation of the source/drain regions 2102 and 2104.

Figure 23:
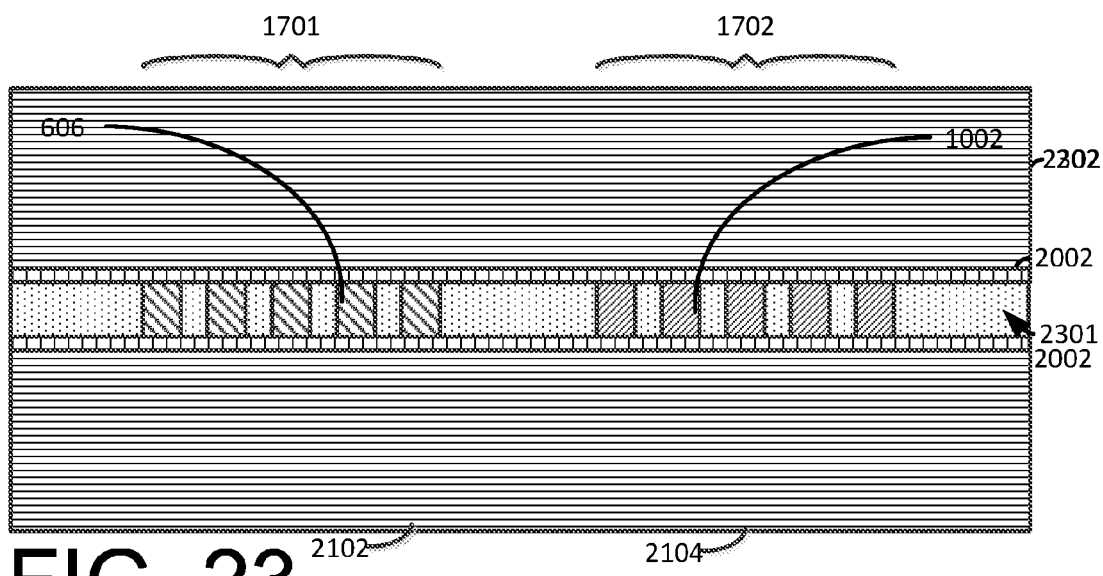
FIG. 23 illustrates a top view of the resultant structure following the formation of an inter-level dielectric layer and removal of the sacrificial gates (of FIG. 22).

FIG. 23 illustrates a top view of the resultant structure following the formation of an inter-level dielectric layer 2302 and removal of the sacrificial gates 1901 (of FIG. 22). The inter-level dielectric layer 2302 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 802 is deposited by a deposition process, including, but not limited to CVD, PVD, plasma enhanced CVD, atomic layer deposition (ALD), evaporation, chemical solution deposition, or like processes. Following the deposition of the inter-level dielectric layer 2302, a planarization process such as, for example, chemical mechanical polishing is performed.

The removal of the sacrificial gates 1901 to form cavities 2301 that expose the channel regions of the fins 606 and 1002. The sacrificial gates 1901 may be removed by performing a dry etch process, for example, ME, followed by a wet etch process. The wet etch process is selective to (will not substantially etch) the spacers 2202 and the inter-level dielectric material. The chemical etch process may include, but is not limited to, hot ammonia or tetramethylammonium hydroxide (TMAH).

Figure 24:
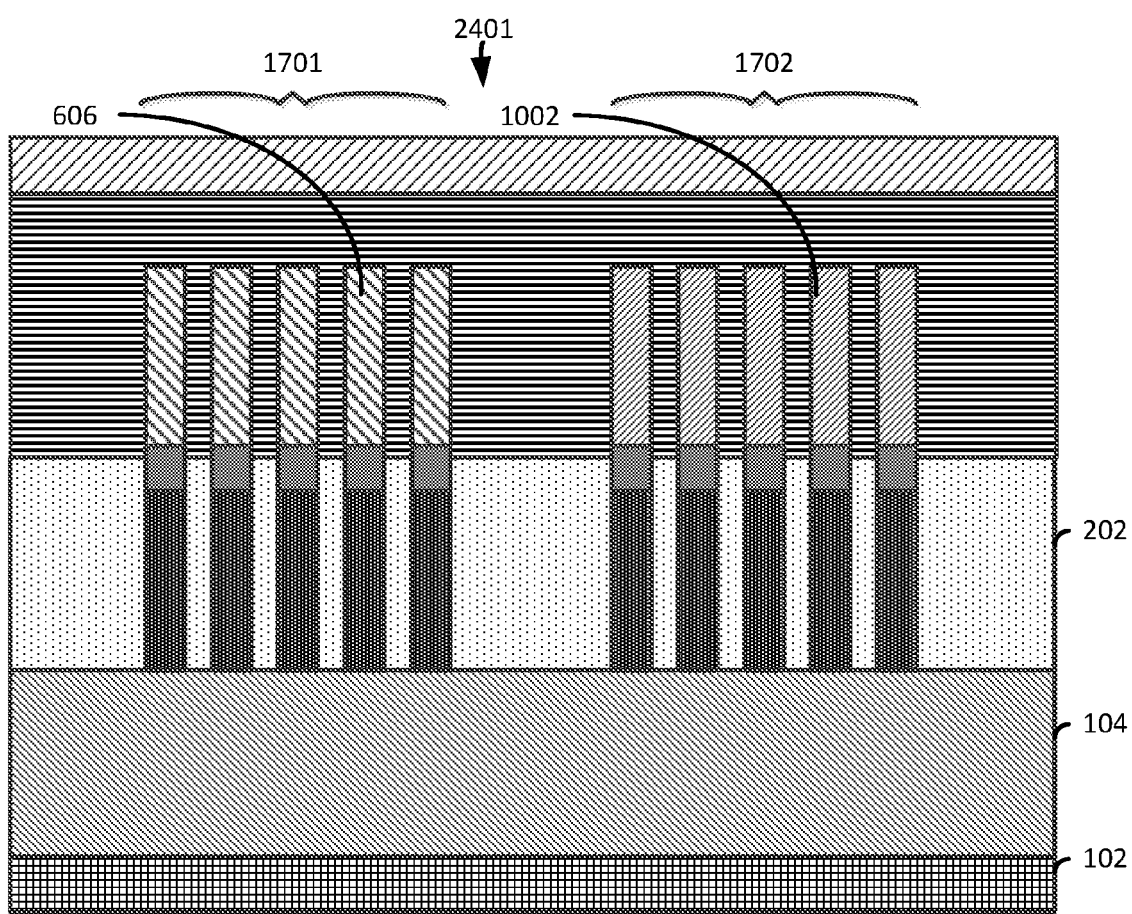
FIG. 24 illustrates a cutaway view through channel regions of the fins and of the resultant structure following the formation of a replacement metal gate stack.

FIG. 24 illustrates a cutaway view through channel regions of the fins 606 and 1002 of the resultant structure following the formation of a replacement metal gate stack (gate stack) 2401. The gate stack 2401 include high-k metal gates formed, for example, by filling the cavity 2301 (of FIG. 23) with one or more dielectric materials (not shown), one or more workfunction metals (not shown), and one or more metal gate conductor materials (not shown). The gate dielectric material(s) can be a dielectric material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) may be disposed over the gate dielectric material. The type of work function metal(s) depends on the type of transistor and may differ between the nFET and pFET devices. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor material(s) is deposited over the gate dielectric materials and work function metal(s) to form the gate stacks 2401. Non-limiting examples of suitable conductive metals include aluminum (Al), platinum (Pt), gold (Au), tungsten (W), titanium (Ti), or any combination thereof. The gate conductor material(s) may be deposited by a suitable deposition process, for example, CVD, PECVD, PVD, plating, thermal or e-beam evaporation, and sputtering.

Following the deposition of the gate dielectric materials, the work function metal(s), and the gate conductor material(s), planarization process, for example, chemical mechanical planarization (CMP), is performed to remove the overburden of the deposited gate materials and form the gate stack 2401.

The embodiments described herein provide for forming CMOS devices with dissimilar active regions including III-V composite materials on a substrate with epitaxially grown materials substantially free of undesirable defects that may degrade the performance of CMOS devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:

forming an insulator layer on a semiconductor substrate;

removing portions of the insulator layer to form a first cavity and a second cavity, the first cavity exposing a first portion of the semiconductor substrate and the second cavity exposing a second portion of the semiconductor substrate;

growing a first semiconductor material in the first cavity and the second cavity;

growing a second semiconductor material on the first semiconductor material in the first cavity and the second cavity;

growing a third semiconductor material on the second semiconductor material in the first cavity and the second cavity;

forming a mask over the third semiconductor material in the first cavity;

removing the third semiconductor material from the second cavity to expose the second semiconductor material in the second cavity; and growing a fourth semiconductor material on the second semiconductor material in the second cavity.

2. The method of claim 1, wherein the first semiconductor material includes a first III-V compound material.

3. The method of claim 1, wherein the second semiconductor material includes a second III-V compound material.

4. The method of claim 1, wherein the third semiconductor material includes silicon germanium.

5. The method of claim 1, wherein the third semiconductor material includes germanium.

6. The method of claim 1, wherein the fourth semiconductor material includes a third III-V compound material.

7. The method of claim 1, wherein the insulator layer includes an oxide material.

8. The method of claim 1, further comprising performing a planarizing process to remove portions of the third semiconductor material prior to forming the mask.

9. The method of claim 1, further comprising performing a planarizing process to remove portions of the fourth semiconductor material after growing the fourth semiconductor material.

10. A method for forming a semiconductor device, the method comprising:
    forming an insulator layer on a semiconductor substrate;
    removing portions of the insulator layer to form a first cavity and a second cavity, the first cavity exposing a first portion of the semiconductor substrate and the second cavity exposing a second portion of the semiconductor substrate;
    growing a first semiconductor material in the first cavity and the second cavity;
    growing a second semiconductor material on the first semiconductor material in the first cavity and the second cavity;
    growing a third semiconductor material on the second semiconductor material in the first cavity and the second cavity;
    forming a mask over the third semiconductor material in the first cavity;
    removing the third semiconductor material from the second cavity and the second semiconductor material from the second cavity to expose the first semiconductor material in the second cavity; and
    growing a fourth semiconductor material on the first semiconductor material in the second cavity; and
    growing a fifth semiconductor material on the second semiconductor material in the second cavity.

11. The method of claim 10, wherein the first semiconductor material includes a first III-V compound material.

12. The method of claim 10, wherein the second semiconductor material includes a second III-V compound material.

13. The method of claim 10, wherein the third semiconductor material includes silicon germanium.

14. The method of claim 10, wherein the third semiconductor material includes germanium.

15. The method of claim 10, wherein the fourth semiconductor material includes a fourth III-V compound material.

16. The method of claim 10, wherein the fifth semiconductor material includes a fifth III-V compound material.

17. The method of claim 10, wherein the insulator layer includes an oxide material.

* * * * *